(12) United States Patent
Huang et al.

(10) Patent No.: US 9,003,336 B2
(45) Date of Patent: Apr. 7, 2015

(54) MASK ASSIGNMENT OPTIMIZATION

(71) Applicant: Taiwan Semiconductor Manufacturing Company, Ltd., Hsin-Chu (TW)

(72) Inventors: Wen-Chun Huang, Tainan (TW); Ken-Hsien Hsieh, Taipei (TW); Ming-Hui Chih, Luzhou (TW); Chih-Ming Lai, Hsinchu (TW); Ru-Gun Liu, Zhubei (TW); Ko-Bin Kao, Shengang Township, Taichung County (TW); Chii-Ping Chen, Hsinchu (TW); Dian-Hau Chen, Hsinchu (TW); Tsai-Sheng Gau, Hsinchu (TW); Burn Jeng Lin, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/781,980

(22) Filed: Mar. 1, 2013

(65) Prior Publication Data
US 2014/0248768 A1     Sep. 4, 2014

(51) Int. Cl.
*G06F 17/50* (2006.01)
*H01L 21/768* (2006.01)

(52) U.S. Cl.
CPC .............. *H01L 21/768* (2013.01); *G06F 17/50* (2013.01)

(58) Field of Classification Search
USPC ........................................................... 716/52
See application file for complete search history.

(56) References Cited

U.S. PATENT DOCUMENTS

2012/0135600 A1*  5/2012  Lin et al. ....................... 438/667

* cited by examiner

*Primary Examiner* — Eric Lee
(74) *Attorney, Agent, or Firm* — Haynes and Boone, LLP (57) ABSTRACT

A method for optimizing mask assignment for multiple pattern processes includes, through a computing system, defining which of a number of vias to be formed between two metal layers are critical based on metal lines interacting with the vias, determining overlay control errors for an alignment tree that defines mask alignment for formation of the two metal layers and the vias, and setting both the alignment tree and mask assignment for the vias so as to maximize the placement of critical vias on masks that have less overlay control error to the masks forming the relevant metal lines.

18 Claims, 9 Drawing Sheets

MASK ASSIGNMENT OPTIMIZATION

BACKGROUND

Multiple patterning is a technique used in photolithographic processes to allow for greater feature density. When fabricating integrated circuits, masks are used to selectively expose a photo-resist layer to a radiation (light) source. As the pattern density increases, it becomes more difficult to use masks with features in the low nanometer range because features that small are beyond the resolution of the light source. Thus, multiple masks may be used when two features in a particular pattern are too close to form in the same mask.

Additionally, integrated circuit fabrication involves the formation of several layers. Overlay control methods are used to ensure that each successive layer or mask is properly aligned to a previously deposited or formed layer. Nevertheless, there is typically a small overlay error for each alignment. For example, the overlay error may range between 5 and 10 nanometers. This overlay error can be even more problematic when using multiple patterning.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
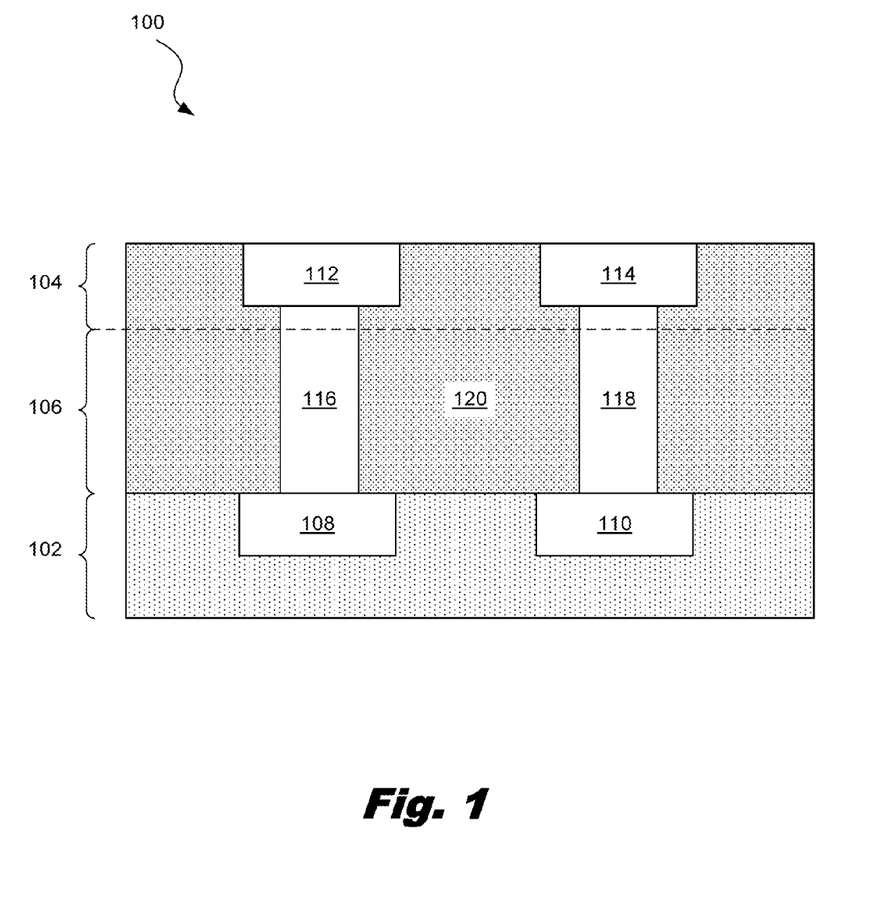
FIG. 1 is a diagram showing illustrative layers of an integrated circuit, according to one example of principles described herein.

Referring now to the figures, FIG. 1 is a diagram showing illustrative layers of an integrated circuit. Integrated circuits often include conductive metal lines to interconnect the various semiconductor devices fabricated onto a wafer. These metal lines are often formed in several layers. To connect a metal line from one layer to another, vias are formed between the layers at specified locations.

FIG. 1 illustrates two metal layers 102, 104 and a via layer 106. The first layer 102 may be part of a semiconductor wafer or some type of dielectric material. According to certain illustrative examples, a pattern is formed into the first layer 102. This pattern can be formed through photolithographic processes. In a photolithographic process, a photo-resist material is deposited onto the material. A mask then covers the layer but exposes certain regions where the metal lines will be formed. The exposed regions of the photo-resist are then removed. Metal lines 108, 110 may then be formed into the pattern formed by the photolithographic process. Various techniques may be used to form the metal lines such as vapor deposition.

In multiple pattern processing, different metal lines on the same layer may be formed from different masks. For example, a first mask is used to form the pattern for the first metal line 108. After that pattern is formed, a second photo-resist layer and a second mask is used to form the pattern for the second metal line 110. To determine which features are formed with which mask, a mask assignment process is used which will be described in further detail below.

After the metal lines 108, 110 have been deposited, an additional layer of dielectric material 120 is deposited over the metal lines 108. An additional set of metal lines 112, 114 and vias 116, 118 are formed into this additional dielectric material. First, the additional metal line patterns are formed. Like with the first layer 102, these metal line patterns may be formed using two different masks.

After the patterns for the metal lines 112, 114 have been formed, vias are formed into the via layer 106. A via is formed by etching a hole from one metal line pattern down to the metal line of the layer below. For example, within the pattern for the first metal line 112, a via 116 is formed down to the first metal line 108 of the first layer 102. Likewise, a second via 118 is formed within the pattern for the second metal line 114 down to the second metal line 110 of the first layer 102. Like the vias, multiple masks may be used to form the vias. For example, one mask may be used to create the first via 116 while a different mask may be used to form the second via 118.

When aligning each mask, it is important to take into account the possible overlay error. For example, it is possible that a particular via may be formed a few nanometers away from where it is intended to be formed. As the patterning of integrated circuits becomes denser, the overlay control error becomes a larger issue. Particularly, if a via is not placed directly on a metal line, the electrical connection between the metal line and the via may be degraded. Alternatively, if a via is placed too close to a metal line to which it is not supposed to connect, it may form a short circuit. Thus, care should be taken when designing the pattern and alignment process for a particular integrated circuit.

Figure 2:
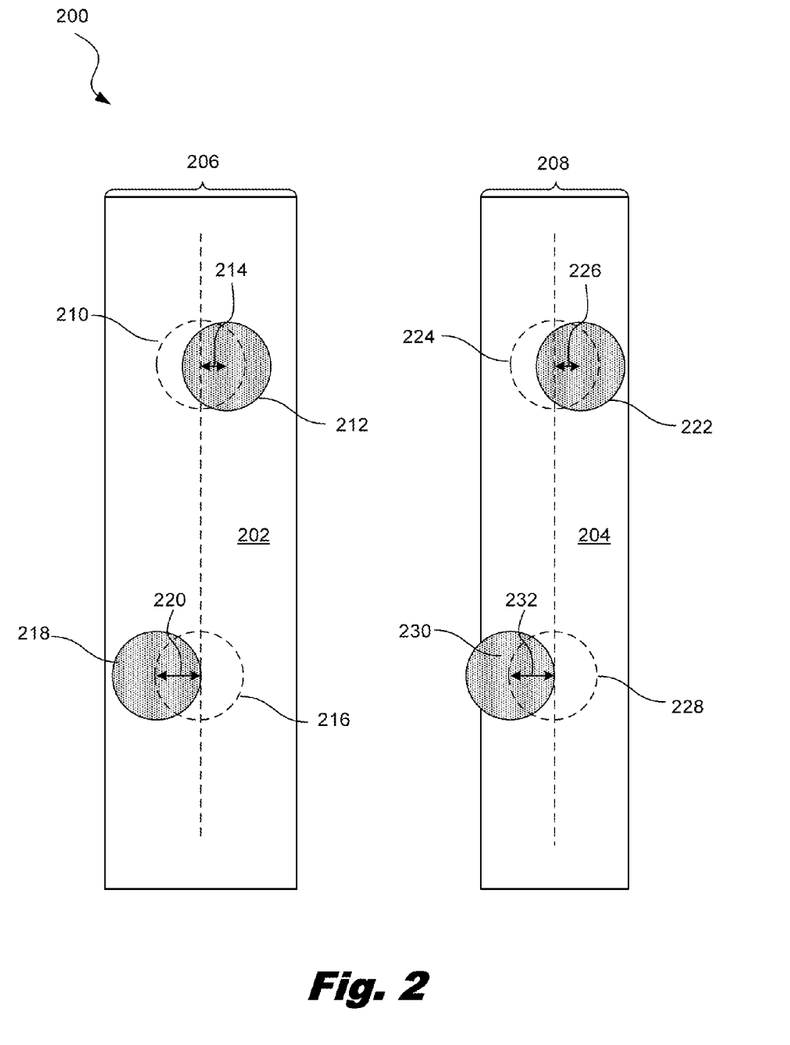
FIG. 2 is a diagram showing illustrative via placement on interacting metal, according to one example of principles described herein.

FIG. 2 is a diagram showing illustrative via placement 200 on interacting metal. For various reasons, different metal lines may be of different widths depending on the nature of the pattern. For vias that connect to narrower metal lines, it is important to have a smaller overlay error. These vias may be defined as critical vias.

FIG. 2 illustrates a wide metal line 206 and a narrow metal line 208. In one example, a via 212 is offset from its intended location 210 by a distance 214 resulting from a direct overlay control error. In another example a via 218 is offset from its intended location 216 by a distance 220 resulting from an indirect overlay control error. Because the metal line 206 is relatively wide, a good connection can be made regardless of whether there is a direct or indirect overlay control error.

In one example, a via 222 is offset from its intended location 224 on the narrow metal line 208 by a distance 226 resulting from a direct overlay control error. In another example, a via 230 is offset from its intended location 228 by a distance 232 resulting from an indirect overlay control error. As can be seen, the via 230 extends beyond the narrow metal line 208. This can lead to a less than ideal connection between the via 230 and the metal line 208. Thus, vias that connect or interact with narrow metal lines should be placed on a mask that is directly aligned to the mask forming that narrow metal lines. This allows for direct overlay control between the mask creating the via and the mask creating the narrow metal line.

Thus, a critical via can be defined as any via that interacts with an overlying or underlying metal line that is less than a specified width. For example, a rule may define a critical via as one that interacts with a metal line that is narrower than 38 nanometers. During the mask assignment process, all the narrow metal lines may be put on one mask while all the wider metal lines are put on another mask. The vias can be assigned to a mask based on which mask will align with the narrow metal line mask during the fabrication process.

Figure 3:
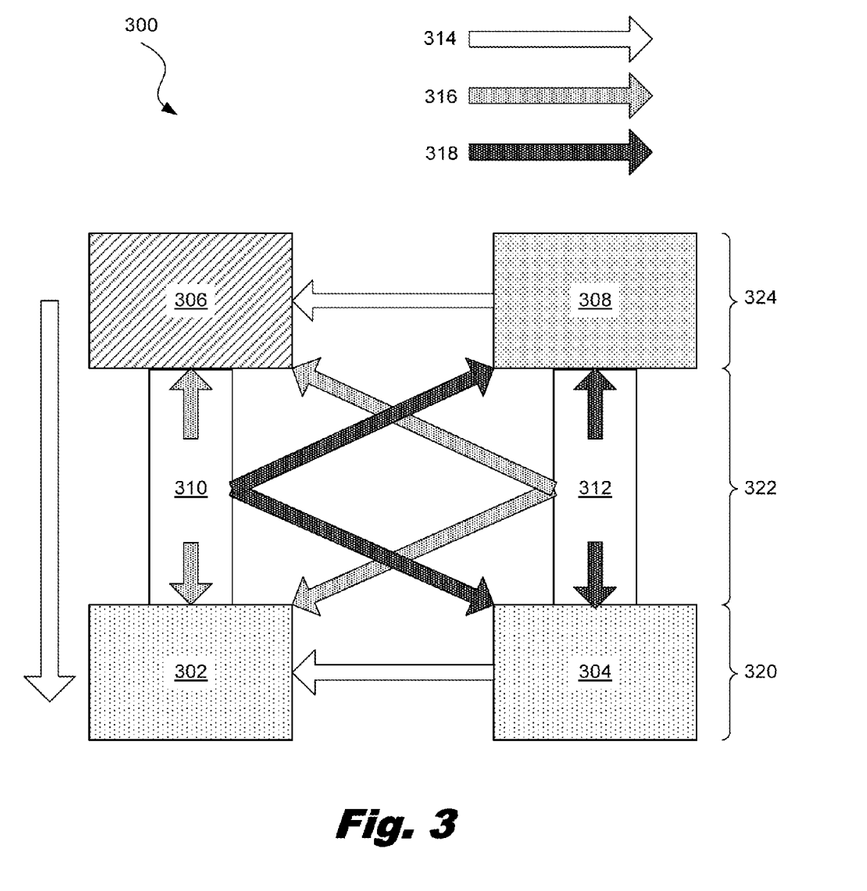
FIG. 3 is a diagram showing an illustrative alignment tree, according to one example of principles described herein.

FIG. 3 is a diagram showing an illustrative alignment tree 300. The alignment tree defines how masks for each layer are aligned. According to certain illustrative examples, the second mask 304 for the first metal layer 320 is aligned to the first mask 302 of the first metal layer 320. Because the mask 304 is directly aligned to the other mask 302, there is direct overlay control. This is indicated by the solid arrow 314. The first mask 306 of the second metal layer 324 may also be aligned to the first mask 302 of the first metal layer 320. The second mask 308 of the second layer is aligned to the first mask 306 of the second metal layer 324.

The first via mask 310 of the via layer 322 is aligned to both the first metal mask 302 of the first metal layer 320 and the first mask 306 of the second metal layer 324. The lightly shaded arrow 316 indicates a direct overlay control to two different layers. Because there is a direct overlay control to the first metal mask 302 of the first metal layer 320 and the first mask 306 of the second metal layer 324, there is an indirect overlay control to the second mask 304 of the first metal layer 320 and the second metal mask 308 of the second metal layer 324.

Likewise, the second via 312 is also aligned to both the first metal mask 302 of the first metal layer 320 and the first mask 306 of the second metal layer 324. Consequently, there is also an indirect overlay control error to the second mask 304 of the first metal layer 320 and the second metal mask 308 of the second metal layer 324. In such cases, vias that are defined as critical because of a narrow interacting metal line of the second metal layer 324 could achieve a smaller overlay error to the narrow interacting metal by the metal assignment of the second metal layer 324. Thus, when assigning each of the metal lines in a particular pattern, the metal lines connected to critical vias are placed on the metal mask that aligns to the via mask having those critical vias. In this case, all metal lines which connect to critical vias are placed on the first mask 306 of the second metal layer 324 because via masks 310 and 312 have direct overlay control to metal mask 306.

FIG. 3 also illustrates the indirect overlay control error between the first via mask 310 and both the second mask 308 of the second metal layer 324 and the second mask 304 of the first metal layer 320. This is indicated by the dark shaded arrow 318. It is indirect overlay control because the first via mask has a direct overlay control alignment to both the first mask 302 of the first metal layer 320 and the first mask 306 of the second metal layer 324.

Figure 4:
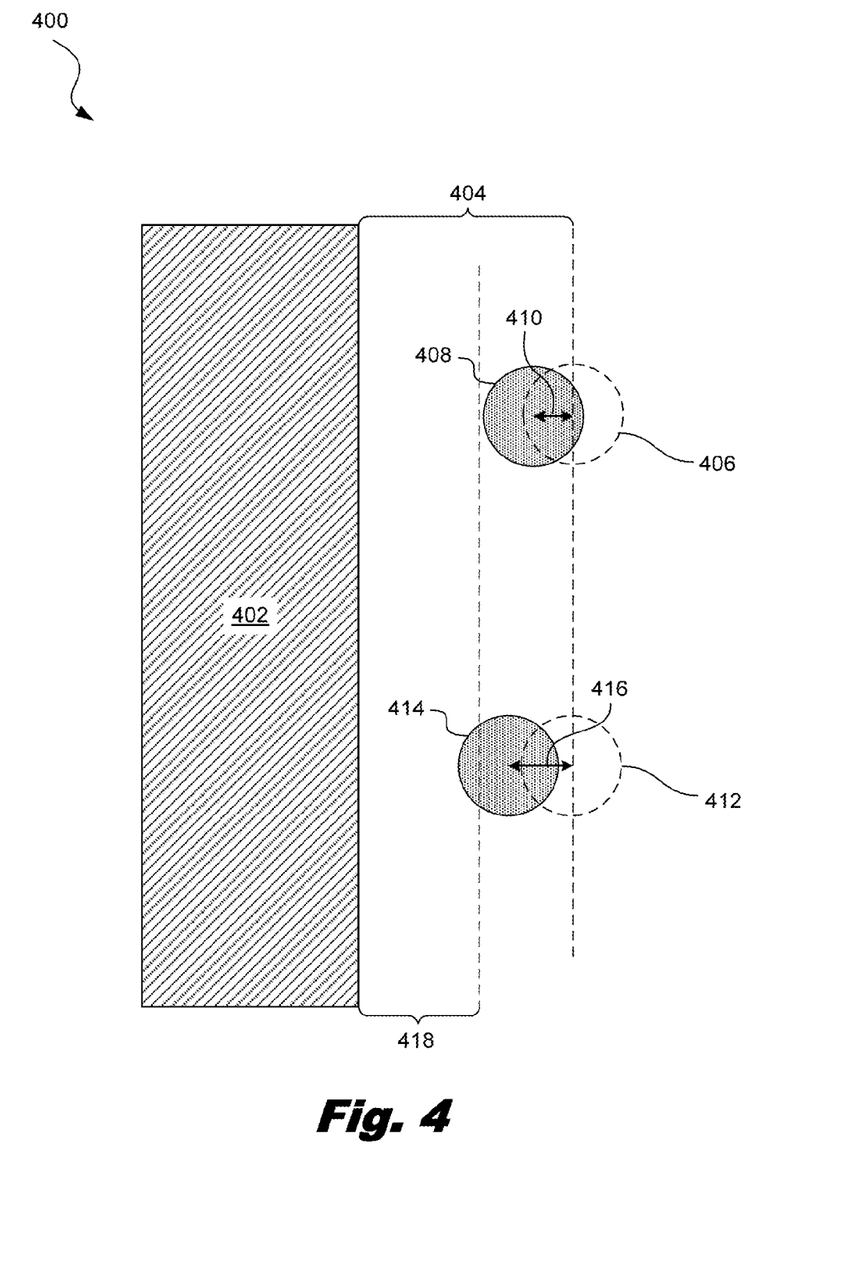
FIG. 4 is a diagram showing illustrative via placement near a non-interacting metal line, according to one example of principles described herein.

FIG. 4 is a diagram showing illustrative via placement 400 near a non-interacting metal line. In some situations a via may be defined as critical if it runs too close to a non-interacting metal. Thus, a rule may define a via as critical if it is within a specified distance from a non-interacting metal line.

FIG. 4 illustrates a non-interacting metal line 402. In one example where there is direct overlay control between the mask that forms a via 408 and the mask that forms metal line 402. The intended location 406 of this via 408 is at a specified distance 404 from the metal line 402. Even with the overlay control error, the via does not come within a threshold distance 418 and is thus not considered problematic.

In a different example where there is an indirect overlay control between the mask that forms a via 414 and the mask that forms the metal line 402. The intended location 412 of the via 414 is at a specified distance 404 from the metal line. But, due to the indirect overlay control error, which is greater than the direct overlay control error, it is possible that the via 414 will be placed too close to the metal line 402. Thus, such a via may be defined as a critical via so that it can be assigned to masks that align to the non-interacting metal line 402.

Figure 5:
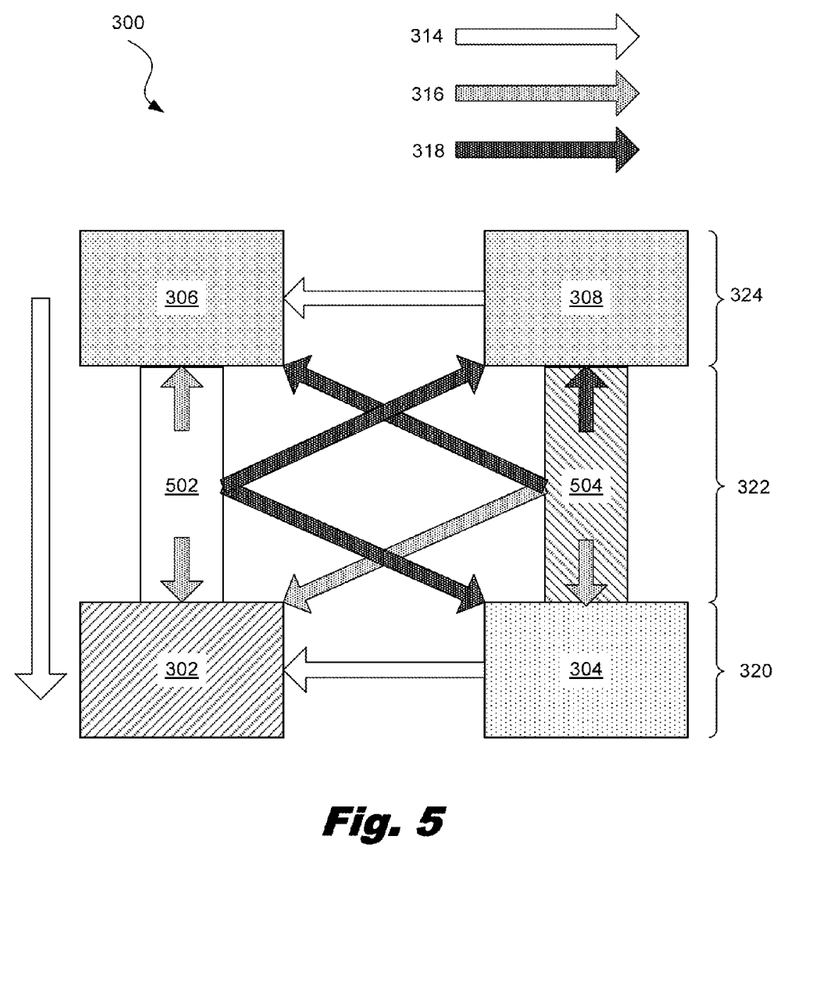
FIG. 5 is a diagram showing an illustrative alignment tree, according to one example of principles described herein.

FIG. 5 is a diagram showing an illustrative alignment tree 500. According to certain illustrative examples, the second mask 304 for the first metal layer 320 is aligned to the first mask 302 of the first metal layer 320. The first mask 306 of the second metal layer 324 may be aligned to the first mask 302 of the first metal layer 320. The second mask 308 of the second metal layer 324 is aligned to the first mask 306 of the second metal layer 324.

The first via mask 502 is aligned to both the first metal mask 302 of the first metal layer 320 and the first mask 306 of the second metal layer 324. Because there is a direct overlay control error to the first metal mask 302 of the first metal layer 320 and the first mask 306 of the second metal layer 324, there is an indirect overlay control to the second mask 304 of the first metal layer 320 and the second metal mask 308 of the second metal layer 324.

Likewise, the second via mask 504 is aligned to both the first metal mask 302 of the first metal layer 320 and the second mask 304 of the first metal layer 320. Consequently, there are also indirect overlay control errors to the first mask 306 and the second metal mask 308 of the second metal layer 324.

In such cases, vias that are defined as critical because they come too close to a non-interacting metal line of the first metal layer 320 could achieve a smaller overlay error to the non-interacting metal line because of the metal assignment of the first metal layer and the via assignment of the via layer. Thus, when assigning each of the metal lines in a particular pattern, the non-interacting metal line comes within a specified distance from a critical via is placed on the metal mask that aligns to the via mask having the critical via. In this case, all metal lines which come close to critical vias are placed on the first mask 302 of the first metal layer 320 because via masks 502 and 504 have direct overlay control to metal mask 302. Moreover, when assigning each of the vias, the critical via is assigned to the via mask 504 that aligns to the first mask 302 and the second mask 304 of the first metal layer with direct overlay control. Other vias which are not critical due to non-interacting metal issues may be placed on either the first via mask 502 or the second via mask 504.

Through use of principles described herein, the mask assignment for multiple patterning photolithographic techniques is optimized. This is done by considering the alignment tree as well as the nature of the pattern itself. Specifically, a via that is defined as critical is placed on a mask that is aligned to the mask used to form the metal lines relevant to that via. For example, if a via is defined as critical because it interacts with a metal line that is narrower than a predefined threshold width, that metal line is the relevant metal line to that via. If a via is defined as critical because it is too close to a non-interacting metal line, that metal line is the relevant metal line to that via.

Figure 6:
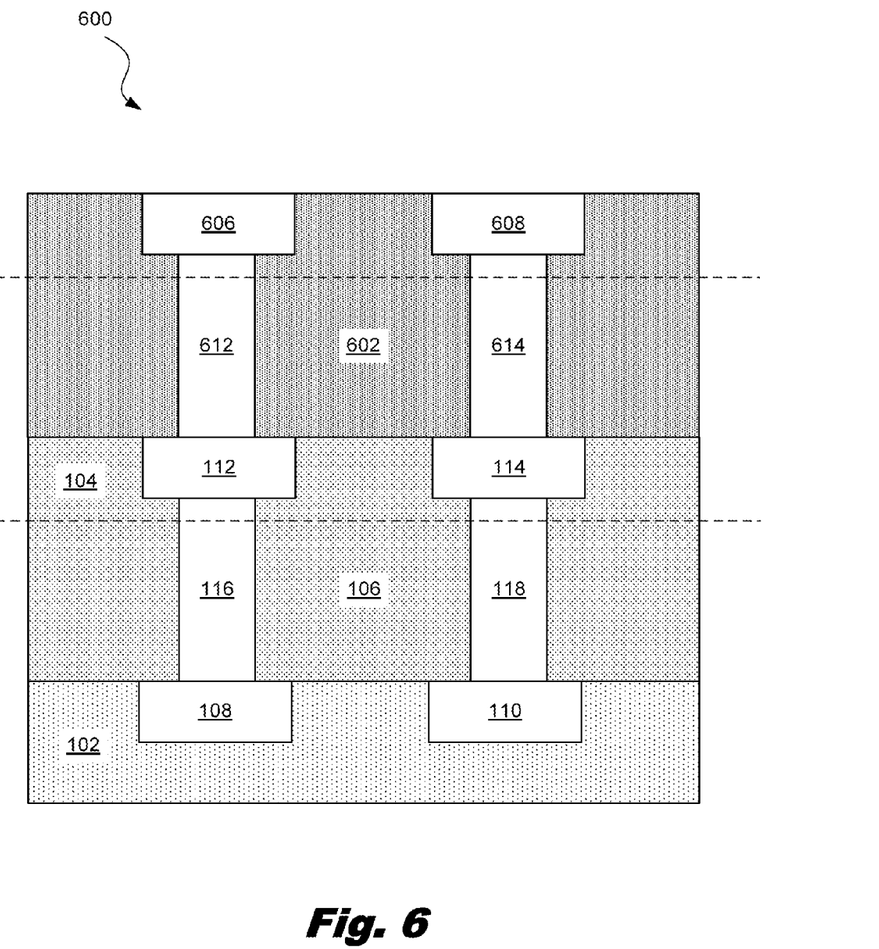
FIG. 6 is a diagram showing an illustrative integrated circuit with multiple metal layers and via layers, according to one example of principles described herein.

FIG. 6 is a diagram showing an illustrative integrated circuit 600 with multiple metal layers and via layers. According to certain illustrative examples, multiple layers of metals and vias may be formed using the optimization of mask alignment and mask assignment described above. Some integrated circuits may have several layer, each layer being optimized according to principles described herein.

According to certain illustrative examples, to form an additional layer, an additional layer of dielectric material 602 is deposited over the metal lines 112, 114 of a previous layer. A metal layer and a via layer are then formed into the additional layer of dielectric material 602. A pattern is then formed for the additional metal lines 606, 608. Vias 612, 614 are then formed by etching a hole from one metal line pattern down to the metal line of the layer below. Then, the metal for the lines 606, 608 and the vias 612, 614 are formed into the dielectric material 602. Each mask can be aligned and the patterns can be designed to minimize errors due to overlay error.

Figure 7:
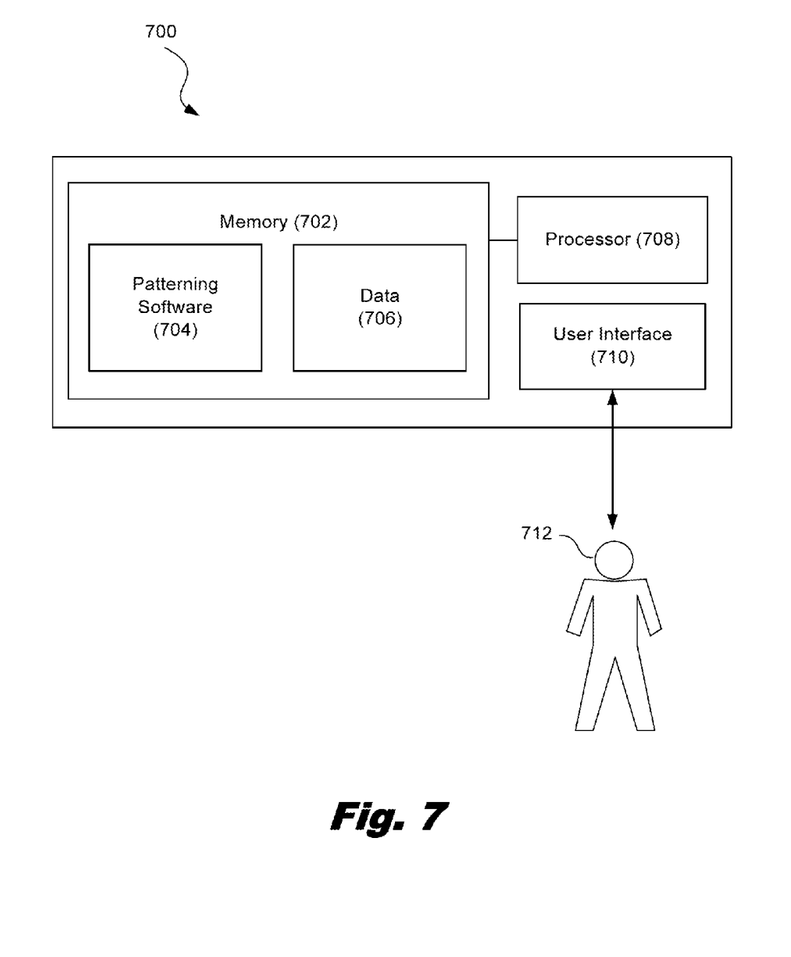
FIG. 7 is a diagram showing an illustrative physical computing system that may be used to set alignment trees and mask assignment for multiple patterning processes, according to one example of principles described herein.

FIG. 7 is a diagram showing an illustrative physical computing system 700 that may be used to design patterns for fabricating integrated circuits. According to certain illustrative examples, the physical computing system 700 includes a memory 702 having patterning software 704 and data 706 stored thereon. The physical computing system 700 also includes a processor 708 and a user interface 710.

There are many types of memory available. Some types of memory, such as solid state drives, are designed for storage. These types of memory typically have large storage volume but relatively slow performance. Other types of memory, such as those used for Random Access Memory (RAM), are optimized for speed and are often referred to as "working memory." The various forms of memory may store information in the form of software 704 and data 706.

The physical computing system 700 also includes a processor 708 for executing the software 704 and using or updating the data 706 stored in memory 702. In addition to storing the patterning software 704, the memory 702 may store an operating system. An operating system allows other applications to interact properly with the hardware of the physical computing system.

The patterning software 704 may include the tools to allow a designer to set the constraints that determine which features of a pattern are deemed critical. The patterning software 704 may also automatically assign each feature to one of multiple masks while taking into account the alignment tree. In some cases, the designer may manually assign particular features to one of the masks. The patterning software 704 is designed so as to maximize the number of critical vias that are placed on masks where there is less overlay control error to the relevant metal lines.

A user interface 710 may provide a means for a user 712 to interact with the system. The user may use various tools such as a keyboard or a mouse to input information into the physical computing system. Additionally, various output devices such as a monitor may be used to provide information to the user 712.

Figure 8:
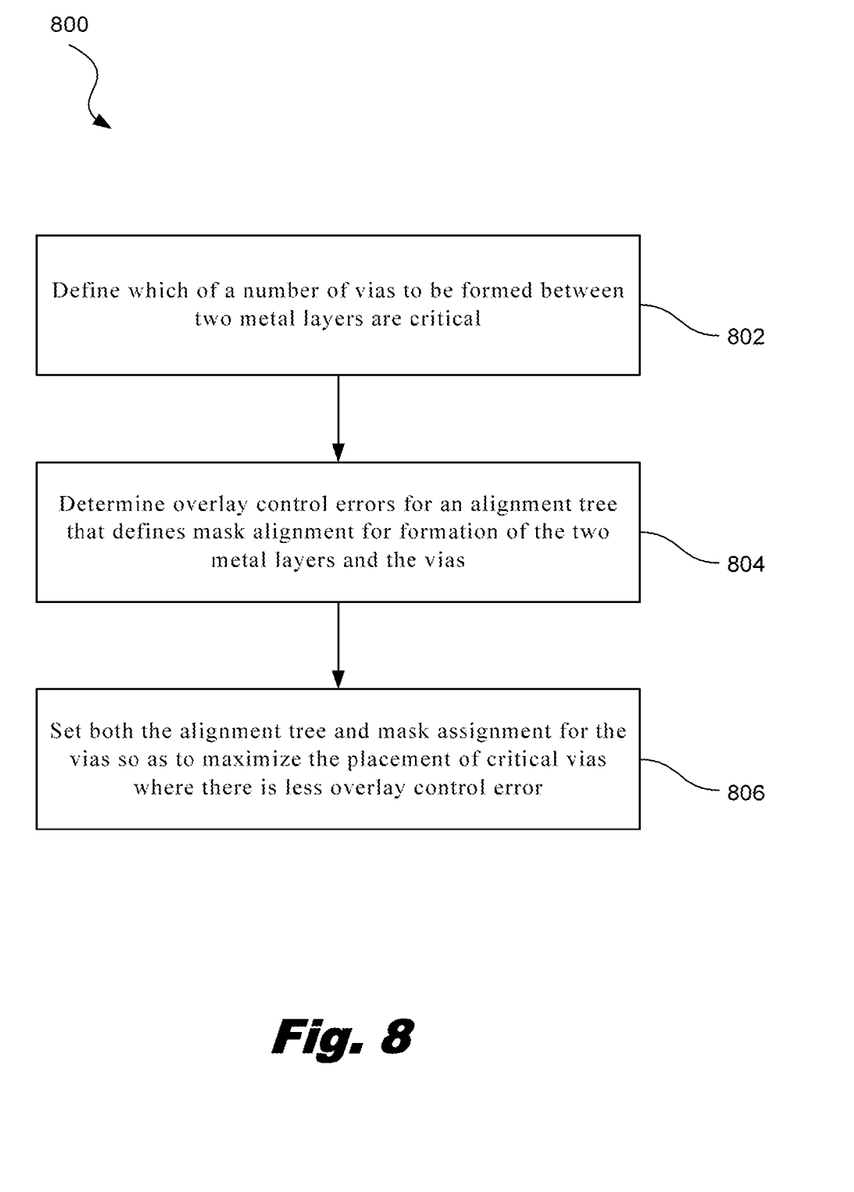
FIG. 8 is a diagram showing an illustrative flowchart for optimizing multiple pattern fabrication processes, according to one example of principles described herein.

FIG. 8 is a diagram showing an illustrative flowchart for optimizing multiple pattern fabrication processes. According to certain illustrative examples, the method includes defining 802 which of a number of vias to be formed between two metal layers are critical based on metal lines relevant to the vias, determining 804 overlay control errors for an alignment tree that defines mask alignment for formation of the two metal layers and the vias, and setting 806 both the alignment tree and mask assignment for the vias so as to maximize the placement of critical vias on masks that have less overlay control error to the masks forming the relevant metal lines.

Figure 9:
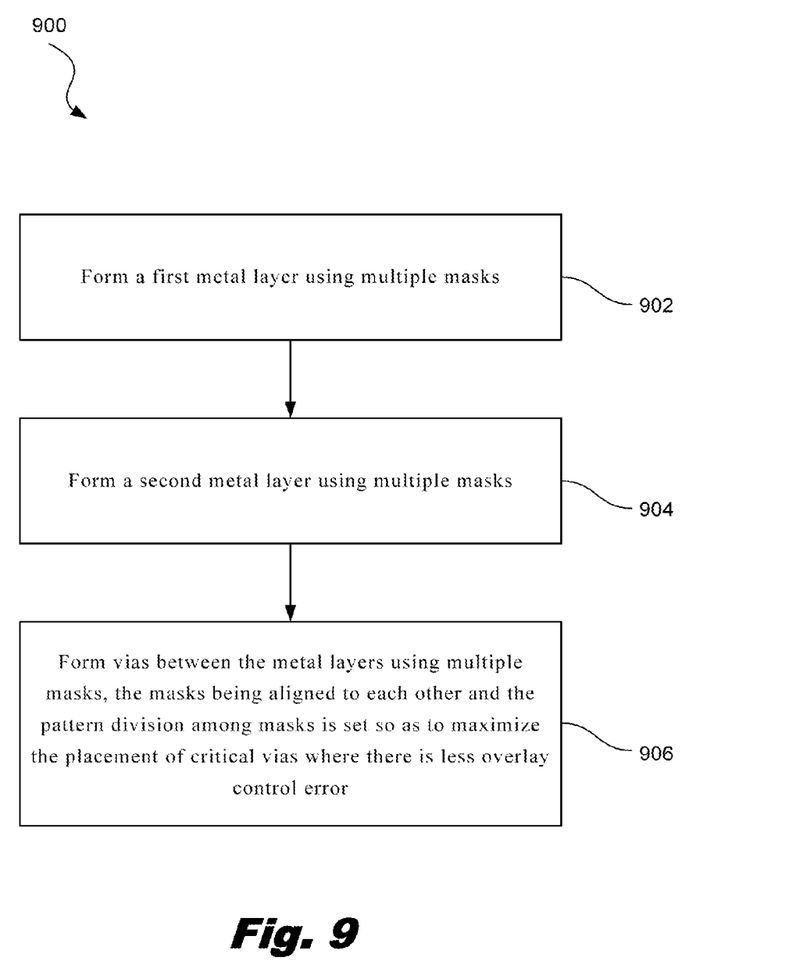
FIG. 9 is a diagram showing an illustrative flowchart for fabricating an integrated circuit where the alignment tree and mask assignment have been optimized, according to one example of principles described herein.

FIG. 9 is a diagram showing an illustrative flowchart for fabricating an integrated circuit where the alignment tree and mask assignment have been optimized. According to certain illustrative examples, the method includes forming 902 a first metal layer using multiple masks, forming 904 a second metal layer using multiple masks, and forming 906 vias between the metal layers using multiple masks. The masks are aligned to each other and the pattern division among masks is set so as to maximize the placement of critical vias on masks where there is less overlay control error to masks forming the metal lines relevant to the critical vias.

According to certain illustrative examples, a method includes defining, with a physical computing system, which of a number of vias to be formed between two metal layers are critical based on metal lines relevant to the vias, with the physical computing system, determining overlay control errors for an alignment tree that defines mask alignment for formation of the two metal layers and the vias, and with the physical computing system, setting both the alignment tree and mask assignment for the vias so as to maximize the placement of critical vias on masks that have less overlay control error to the masks forming the relevant metal lines.

According to certain illustrative examples, a physical computing system includes a processor and a memory. The memory includes machine readable instructions that when executed by the processor, cause the system to define which of a number of vias to be formed between two metal layers are critical based on metal lines relevant to the vias, determine overlay control errors for an alignment tree that defines mask alignment for formation of the two metal layers and the vias, and set both the alignment tree and mask assignment for the vias so as to maximize the placement of critical vias on a mask that has less overlay control error to the mask forming the relevant metal lines.

According to certain illustrative examples, a method for fabricating an integrated circuit where the alignment tree and mask assignment have been optimized includes, forming a first metal layer using multiple masks, forming a second metal layer using multiple masks, and forming vias between the metal layers using multiple masks. The masks are aligned to each other and the pattern division among masks is set so as to maximize the placement of critical vias on masks where there is less overlay control error to masks forming the metal lines relevant to the critical vias.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for optimizing mask assignment for multiple pattern processes, the method comprising:
   through a computing system, determining a first subset of critical vias from a set of vias to be formed between two metal layers, the first subset of vias based on a via-to-metal-line distance such that each via of the first subset of critical vias is to be spaced less than the via-to-metal-line distance from a corresponding non-interacting metal line;
   through the computing system, determining overlay control errors for an alignment tree that defines mask alignment for formation of the two metal layers and the set of vias; and
   through the computing system, setting both the alignment tree and mask assignment for the set of vias so as to maximize the placement of the vias of the first subset of critical vias on masks that have less overlay control error to the masks forming the corresponding non-interacting metal lines.

2. The method of claim 1, further comprising, determining a second subset of critical vias, the second subset of vias interacting with a metal line that is narrower than a predetermined width.

3. The method of claim 2, wherein vias within the second subset of critical vias assigned to a via layer mask that is aligned to a metal layer mask for the interacting metal line for that critical via.

4. The method of claim 1, wherein vias within the first subset of critical vias are assigned to a via layer mask that is aligned to the corresponding non-interacting metal line for that critical via.

5. The method of claim 1, wherein the mask assignment is done automatically according to a predefined set of rules.

6. The method of claim 1, wherein the mask assignment is done manually by a pattern designer.

7. The method of claim 1, wherein the alignment tree defines pattern assignment for more than two metal layers and more than one via layer.

8. A physical computing system comprising:
   a processor; and
   a memory comprising machine readable instructions that when executed by the processor, cause the system to:
      determine a first subset of critical vias from a set of vias to be formed between two metal layers, the first subset of vias based on a via-to-metal-line distance such that each via of the first subset of critical vias is to be spaced less than the via-to-metal-line distance from a corresponding non-interacting metal line;
      determine overlay control errors for an alignment tree that defines mask alignment for formation of the two metal layers and the vias; and
      set both the alignment tree and mask assignment for the vias so as to maximize a placement of vias from the first subset of critical vias on a mask that has less overlay control error to the mask forming the corresponding non-interacting metal lines.

9. The system of claim 8, wherein a second subset of critical vias are vias interacting with a metal line that is narrower than a predetermined width.

10. The system of claim 9, wherein a via within the second subset of vias is assigned to a via layer mask that is aligned to a metal layer mask for the interacting metal line for that critical via.

11. The system of claim 8, wherein a via within the first subset of critical vias is assigned to a via layer mask that is aligned to the corresponding non-interacting metal line for that via.

12. The system of claim 8, wherein the mask assignment is done automatically according to a predefined set of rules.

13. The system of claim 8, wherein the mask assignment is done manually by a pattern designer.

14. The system of claim 8, wherein the alignment tree defines pattern assignment for more than two metal layers and more than one via layer.

15. A method for fabricating metal and via layers in an integrated circuit, the method comprising:
   forming a first metal layer using a first group of masks;
   forming a second metal layer using a second group of masks; and
   forming critical and non-critical vias between the first and second metal layers using a third group of masks, wherein a first subset of critical vias are vias within a predetermined distance from a non-interacting metal line and a second subset of critical vias are vias interacting with a metal line that is narrower than a predetermined width;
   wherein the three groups of masks are aligned to each other and a pattern division among masks is set so as to maximize a placement of critical vias on masks where there is less overlay control error to masks forming the metal lines relevant to the critical vias.

16. The method of claim 15, wherein a critical via within the second subset of critical vias is assigned to a via layer mask that is aligned to a metal layer mask for the interacting metal line for that critical via.

17. The method of claim 15, wherein a critical via within the first subset of critical vias is assigned to a via layer mask that is aligned to the metal layer mask for the non-interacting metal line.

18. The method of claim 15, further comprising, forming additional metal layers and additional via layers.

* * * * *